US011749973B2

(12) United States Patent
Ofenloch et al.

(10) Patent No.: US 11,749,973 B2
(45) Date of Patent: Sep. 5, 2023

(54) RETENTION MECHANISM FOR ATTACHMENT OF TECHNICAL EQUIPMENT UNIT TO A MOUNTING RAIL AND TECHNICAL EQUIPMENT UNIT WITH SUCH A RETENTION MECHANISM

(71) Applicant: TE Connectivity Germany GmbH, Bensheim (DE)

(72) Inventors: Markus Ofenloch, Bensheim (DE); Frank Zimmer, Bensheim (DE); Mohamed Aboulkassem, Bensheim (DE); Friedhelm Kreutz, Bensheim (DE)

(73) Assignee: TE Connectivity Germany GmbH, Bensheim (DE)

( * ) Notice: Subject to any disclaimer, the term of this patent is extended or adjusted under 35 U.S.C. 154(b) by 55 days.

(21) Appl. No.: 17/412,479

(22) Filed: Aug. 26, 2021

(65) Prior Publication Data

US 2022/0069550 A1    Mar. 3, 2022

(30) Foreign Application Priority Data

Aug. 27, 2020   (EP) ................................... 20193177

(51) Int. Cl.
  *H05K 7/14*   (2006.01)
  *H02B 1/052*  (2006.01)
(52) U.S. Cl.
  CPC ......... *H02B 1/0523* (2013.01); *H02B 1/0526* (2013.01); *H05K 7/14* (2013.01)

(58) Field of Classification Search
  CPC .... H02B 1/0523; H02B 1/0526; H02B 1/052; H05K 7/14; H05K 7/1474; H01R 25/145
  See application file for complete search history.

(56) References Cited

U.S. PATENT DOCUMENTS

| 7,516,927 | B2 | 4/2009 | Portal |
| 8,946,978 | B2 | 2/2015 | Ansems et al. |
| 9,276,333 | B1 | 3/2016 | Wu |
| 10,468,871 | B2 * | 11/2019 | Barcey ...................... H01T 4/06 |

(Continued)

FOREIGN PATENT DOCUMENTS

| GB | 2381132 A | 4/2003 |
| JP | S5788988 U | 6/1982 |

(Continued)

OTHER PUBLICATIONS

European Patent Office Search Report, dated Feb. 3, 2021, 8 pages.

(Continued)

*Primary Examiner* — Anthony Q Edwards
*Assistant Examiner* — Hung Q Dang
(74) *Attorney, Agent, or Firm* — Barley Snyder (57) ABSTRACT

A retention mechanism for attaching equipment to a mounting rail comprises a slider including a first retention section and a pivoting lever mechanical coupled to the slider. The slider is movable in a translational manner along a sliding direction with respect to a remaining portion of the retention mechanism. The lever includes a second retention section aligned with the first retention section in the sliding direction. A reception area for receiving the mounting rail is defined between the first retention section and the second retention section.

20 Claims, 5 Drawing Sheets

(56) References Cited

U.S. PATENT DOCUMENTS

| | | |
|---|---|---|
| 2015/0181745 A1 | 6/2015 | Hand et al. |
| 2017/0338649 A1 | 11/2017 | Barcey et al. |
| 2018/0115126 A1 | 4/2018 | Barber et al. |

FOREIGN PATENT DOCUMENTS

| | | |
|---|---|---|
| JP | H078935 U | 2/1995 |
| JP | 2007220383 A | 8/2007 |
| JP | 2014531114 A1 | 11/2014 |
| WO | 2004114466 A1 | 12/2004 |

OTHER PUBLICATIONS

Japanese Office Action with English translation dated Aug. 30, 2022 corresponding to Application No. 2021-135998, 12 pages.

\* cited by examiner

RETENTION MECHANISM FOR ATTACHMENT OF TECHNICAL EQUIPMENT UNIT TO A MOUNTING RAIL AND TECHNICAL EQUIPMENT UNIT WITH SUCH A RETENTION MECHANISM

CROSS-REFERENCE TO RELATED APPLICATIONS

This application claims the benefit of European Patent Application No. 20193177.1 filed on Aug. 27, 2020, the whole disclosure of which is incorporated herein by reference.

FIELD OF THE INVENTION

The present invention relates to a retention mechanism for the attachment of technical equipment, such as a PCB module or a circuit breaker, to a mounting rail (e.g., a DIN rail).

BACKGROUND

In the field of electrical engineering and in other technological fields, technical equipment, or equipment units, are often installed on or in equipment racks. Equipment racks protect the equipment from environmental impact as well as organizing them in a structured manner. In order to achieve optimal and efficient organization, the respective pieces of equipment can be attached and aligned on internal rails of the equipment racks.

Generally, the internal rails of a standardized mounting rail type are used. Therefore, predefined means can be employed for the attachment of the respective equipment units thereto. Existing attachment solutions, however, often contain a complex mechanism involving a multitude of cooperating components, and thus are prone to damage and/or malfunction. Attachment means including mechanisms with a low number of components on the other hand tend to be limited in their functionality, especially with regard to the attachment and detachment processes.

Accordingly, there is a need for a mechanism for attaching technical equipment to mounting rails which comprises only a minimal amount of components, while providing improved functionality.

SUMMARY

According to an embodiment of the present disclosure a retention mechanism for attaching an equipment unit to a mounting rail comprises a slider including a first retention section and a pivoting lever mechanical coupled to the slider. The slider is movable in a translational manner along a sliding direction with respect to a remaining portion of the retention mechanism. The lever includes a second retention section aligned with the first retention section in the sliding direction. A reception area for receiving the mounting rail is defined between the first retention section and the second retention section.

BRIEF DESCRIPTION OF THE DRAWINGS

The invention will now be described by way of example with reference to the accompanying Figures, of which.

DETAILED DESCRIPTION OF THE EMBODIMENTS

Exemplary embodiments of the present disclosure will be described hereinafter in detail with reference to the attached drawings, wherein the like reference numerals refer to the like elements. The present disclosure may, however, be embodied in many different forms and should not be construed as being limited to the embodiment set forth herein; rather, these embodiments are provided so that the present disclosure will be thorough and complete, and will fully convey the concept of the disclosure to those skilled in the art.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Embodiments of the present disclosure include a retention mechanism for attaching technical equipment, such as a PCB module or a circuit breaker, to a mounting rail (e.g., a DIN rail). The retention mechanism comprises a slider which is movable in a translational manner along a sliding direction, and a lever which is pivotable about a pivoting axis. The lever is mechanically coupled with the slider. The slider comprises a first retention section and the lever comprises a second retention section aligned with the first retention section in the sliding direction. A reception area for receiving the mounting rail is defined between the first retention section and the second retention section. The retention mechanism according to embodiments of the present disclosure combines two components with different movement characteristics, namely a translational and a pivotal movement, and thus exhibits a broad dynamic behaviour, while having a simple structure. The first retention section and the second retention section are configured to grip or release the mounting rail synchronously, and thus improve the functionality of the retention mechanism.

Figure 4:
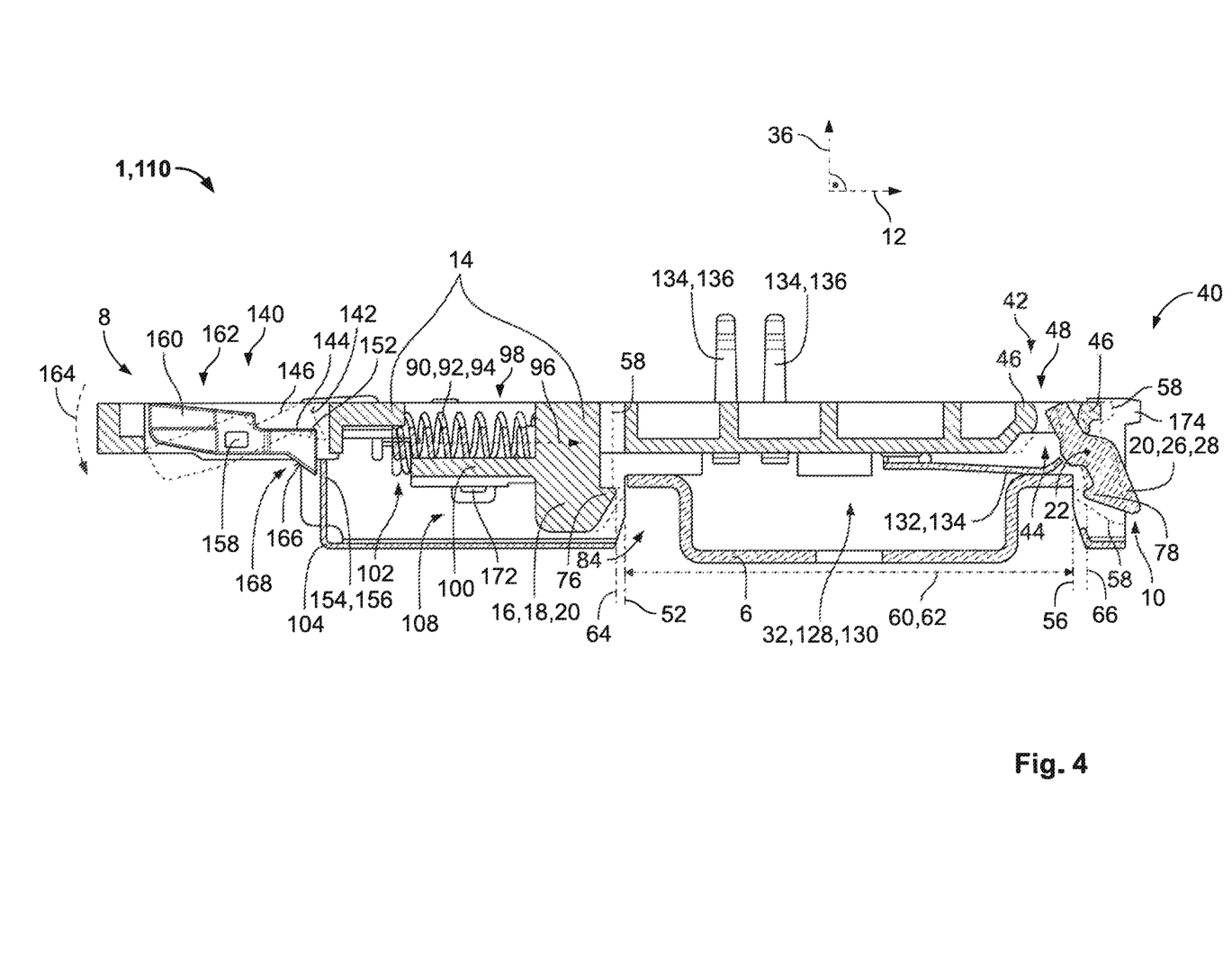
FIG. 4 is a sectional schematic view of the retention mechanism according to the embodiment shown in FIG. 3.
Figure 5:
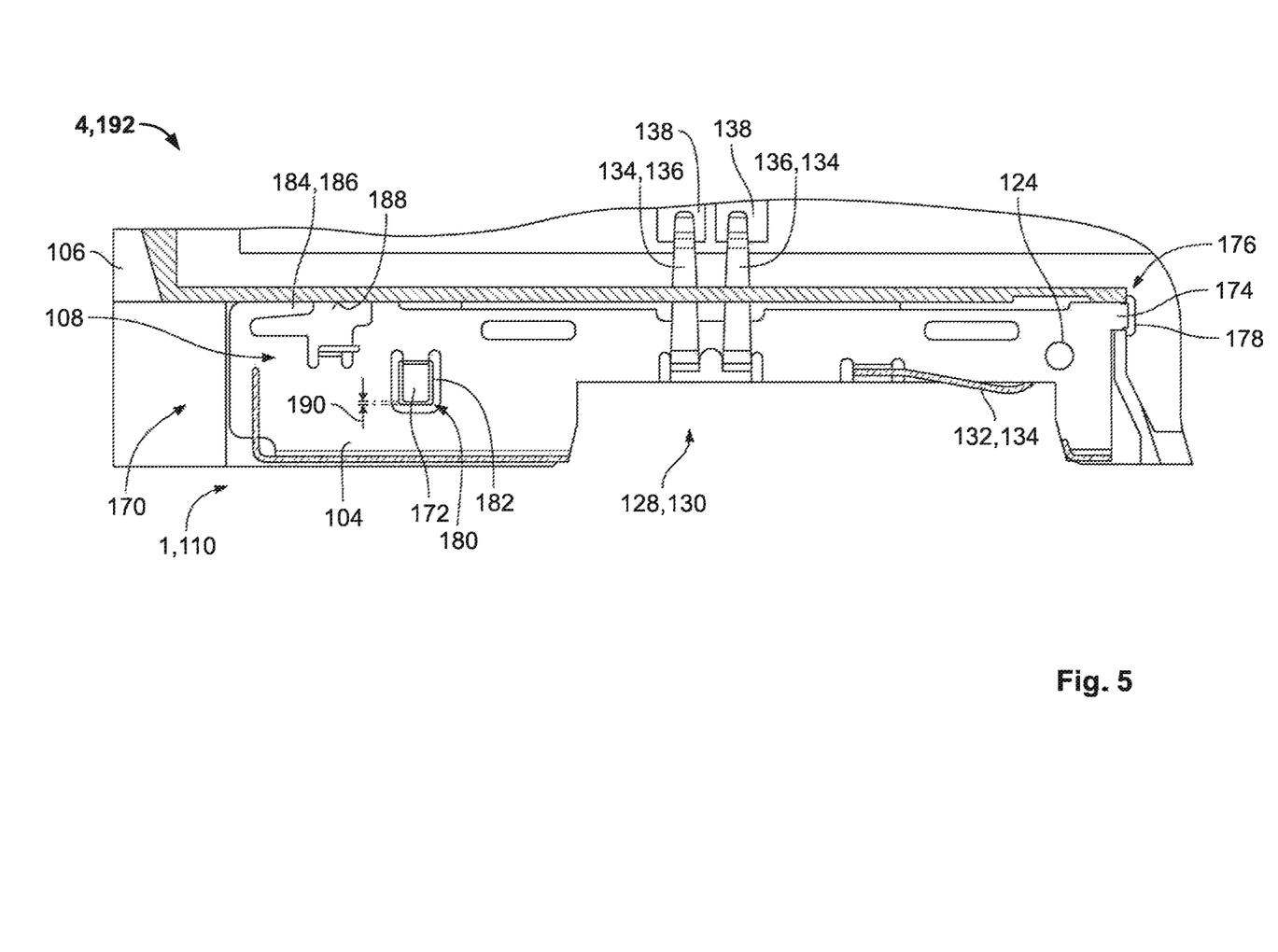
FIG. 5 is a detail sectional view of an equipment unit according to one embodiment of the present disclosure.

As set forth herein, the structure of exemplary embodiments of a retention mechanism 1 for attachment of a technical equipment unit 4 to a mounting rail 6 according to the present disclosure is explained with reference to the exemplary embodiments shown in FIGS. 1-5. Further, FIG. 5 illustrates the structure of the equipment unit 4 according to an embodiment of the present disclosure.

Figure 1:
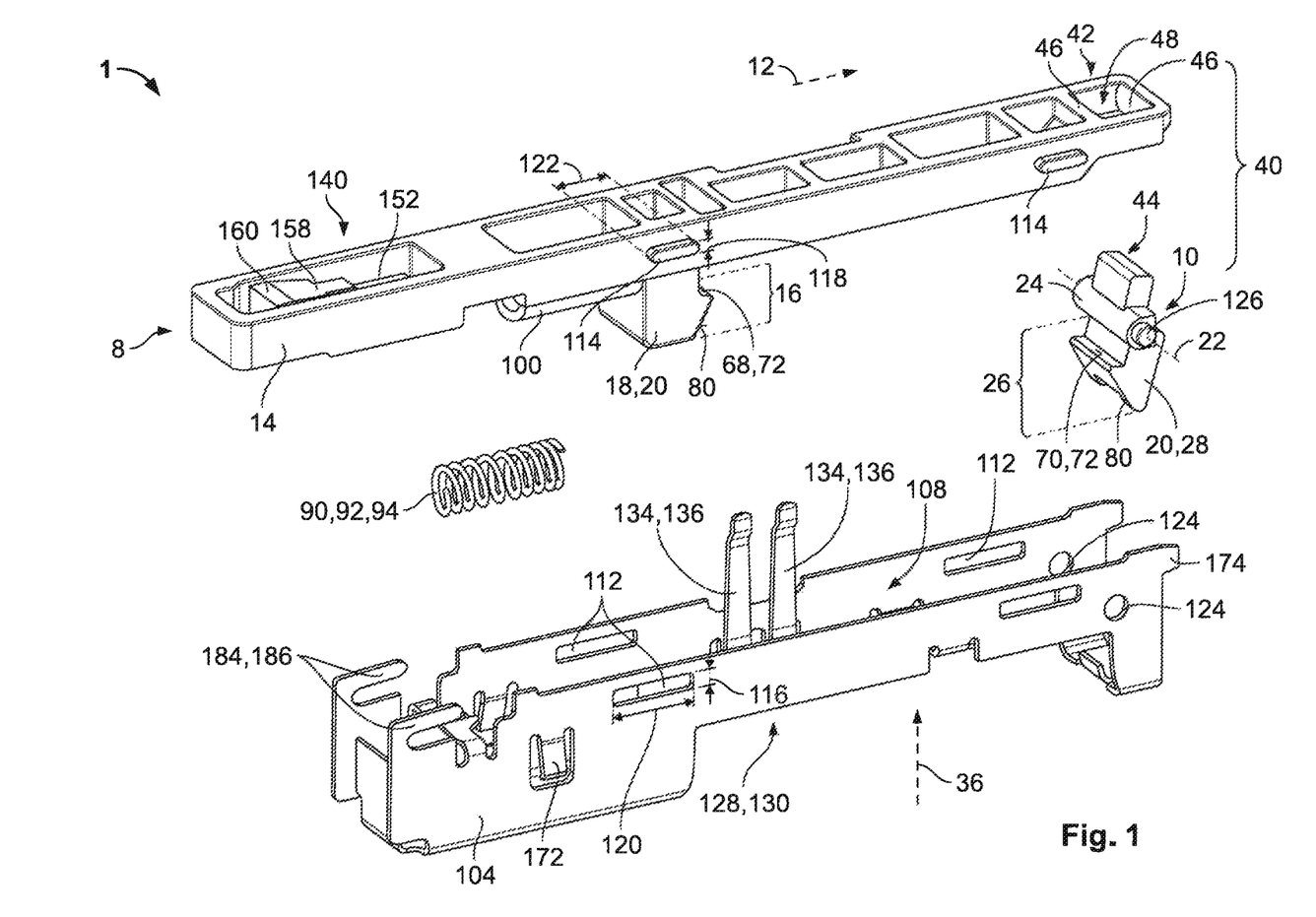
FIG. 1 is an exploded schematic representation of a retention mechanism according to an embodiment of the present disclosure.
Figure 2:
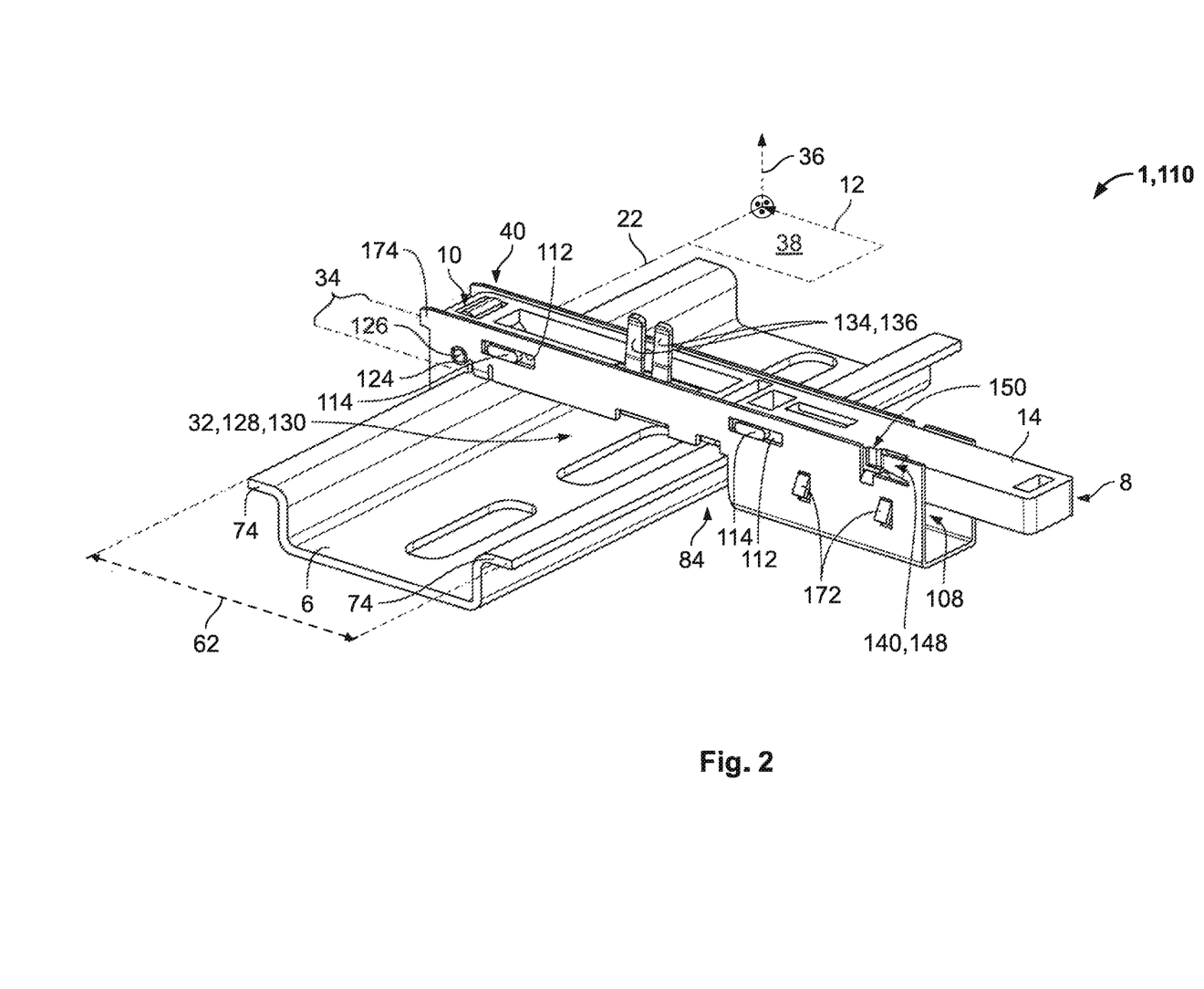
FIG. 2 shows is a perspective schematic view of the retention mechanism according to another embodiment of the present disclosure.

Referring generally to FIG. 1, an exploded perspective view of the retention mechanism 1 according to one possible embodiment of the present disclosure is provided. FIG. 2 is a perspective view of the retention mechanism 1 according to another possible embodiment of the present disclosure attached to the mounting rail 6. As shown, the retention mechanism 1 comprises a slider 8 and a lever 10. The slider 8 is movable in a translational manner along a sliding direction 12 relative to a remainder of the retention mechanism 1. In the exemplary embodiment, the slider 8 comprises an oblong, beam-like main body 14 and a first retention section 16. More specifically, the main body 14 is oblong with respect to the sliding direction 12. The first retention section 16 is formed by a first hook 18. As can be seen in FIG. 1, the first hook 18 is a hook-shaped projection 20 extending away from the main body 14, preferably perpendicularly to the sliding direction 12.

The lever 10 is pivotable about a pivoting axis 22. As will be described in further detail herein with reference to FIG. 4, the lever 10 is mechanically coupled with the slider 8. The lever 10 comprises a cylindrical axle 24 and a second retention section 26. The cylindrical axle 24 extends coaxially with the pivoting axis 22. The second retention section 26 is aligned with the first retention section 16 of the slider 8 in the sliding direction 12. Further, the second retention section 26 is formed by a second hook 28. As shown in FIG. 1, the second hook 28 is a hook-shaped projection 20 extending away from the cylindrical axle 24, preferably radially away with respect to the pivoting axis 22. As is shown in FIG. 2, the pivoting axis 22 of the lever 10 may be held fixedly and rotatably within the retention mechanism 1. Further, the pivoting axis 22 may extend perpendicularly to the sliding direction 12.

Figure 3:
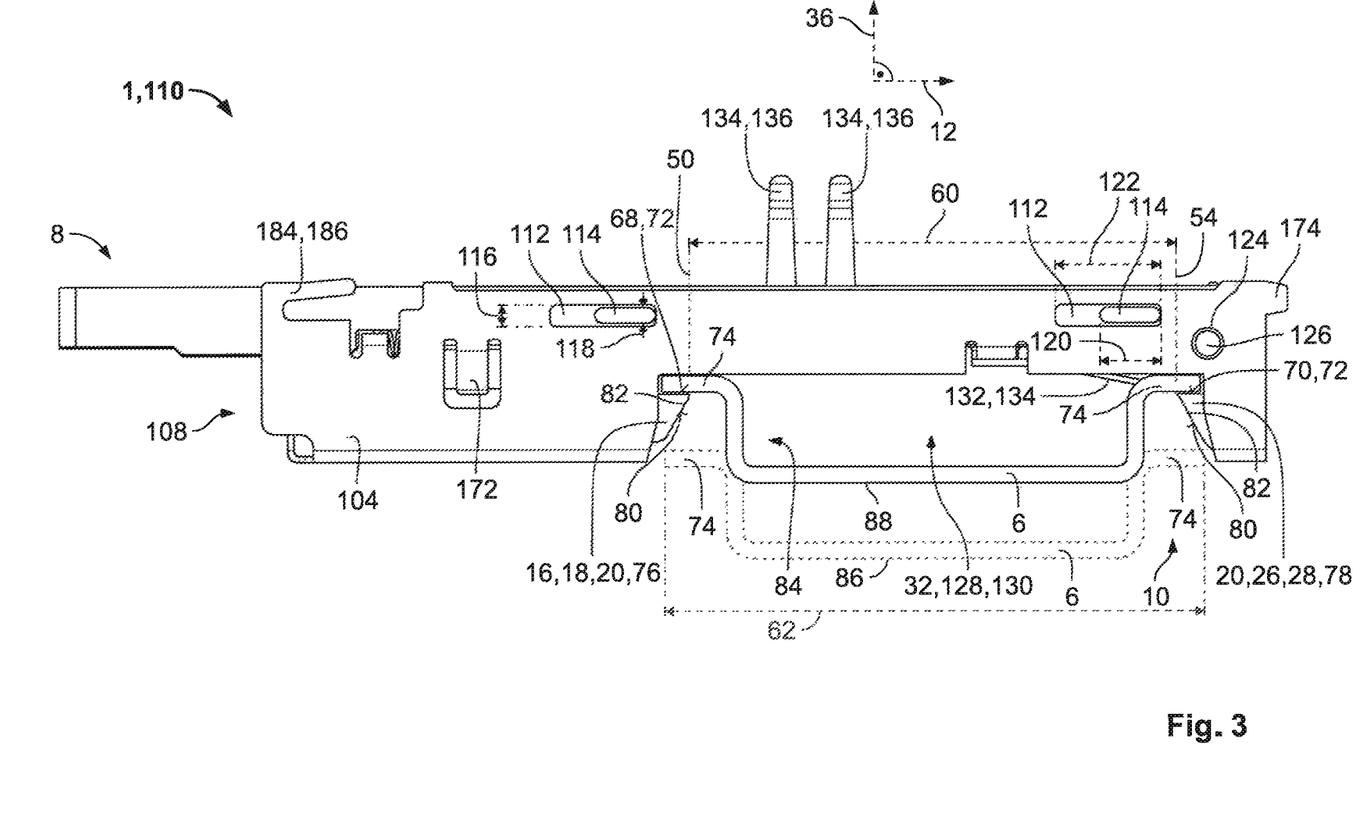
FIG. 3 is a side schematic view of the retention mechanism according to another embodiment of the present disclosure.

FIG. 3 shows a side view of the retention mechanism 1 according to another embodiment of the present disclosure. As can be seen from FIGS. 2 and 3, a reception area 32 for receiving a length section 34 of the mounting rail 6 is defined between the first retention section 16 and the second retention section 26. In particular, the reception area 32 is defined between the first hook 18 and the second hook 28. The reception area 32 may be adapted to receive the mounting rail 6 along a rail mounting direction 36, which is defined with respect to the sliding direction 12 and the direction of the pivoting axis 22. In the exemplary embodiments, the rail mounting direction 36 extends linearly, i.e., straight, towards a plane 38 spanned by the sliding direction 12 and the pivoting axis 22. In particular, the rail mounting direction 36 is perpendicular to the sliding direction 12 and the pivoting axis 22 (see FIG. 2). The mounting rail 6 shown exemplarily in FIGS. 2-4 is a DIN rail with a hat-shaped cross section according to, for example, DIN EN 60715. Alternatively, the mounting rail may have a different cross-section and/or comply with a different standard.

FIG. 4 shows a sectional view of the retention mechanism 1. As illustrated, the mechanical coupling between the lever 10 and the slider 8 is achieved through a mechanical joint 40. The mechanical joint 40 connects an end section 42 of the slider 8 with an end section 44 of the lever 10. The respective end sections 42, 44, which are connected by the mechanical joint 40, are distal from the first hook 18 and the second hook 28, respectively. In particular, the lever 10 may be directly coupled with the slider 8. Specifically, the end section 44 of the lever 10 may be inserted between two inner walls 46 of a cavity 48 formed in the end section 42 of the slider 8. Preferably, the two inner walls 46 may be arranged opposite to each other along the sliding direction 12. The two inner walls 46 may be curved in a circumferential direction with respect to the pivoting axis 22, respectively.

As shown in FIGS. 3 and 4, the slider 8 may be movable between a slider locking position 50 (see FIG. 3) and a slider release position 52 (see FIG. 4). Likewise, the lever 10 may be movable between a lever locking position 54 (see FIG. 3) and a lever release position 56 (see FIG. 4). The respective release positions 52, 56 are depicted as broken lines 58. The lever 10 is movable into the lever release position 56 when the slider 8 is moved into the slider release position 52 and vice versa. Further, the lever 10 moves into the lever locking position 54 when the slider 8 is moved into the slider locking position 50 and vice versa.

When the slider 8 and/or lever 10 is in the respective locking position (i.e., the slider locking position 50 and/or the lever locking position 54) the reception area 32 is narrower, while the reception area 32 is wider when the slider 8 and/or the lever 10 is in the respective release position (i.e., the slider release position 52 and/or the lever release position 56). In particular, an open width 60 of the reception area 32 measured parallel to the sliding direction 12 is less than a width 62 of the mounting rail 6 when the slider 8 and/or the lever 10 is in the respective locking position 50, 54. The open width 60 of the reception area 32 is equal to or larger than the width 62 of the mounting rail 6 when the slider 8 and the lever 10 is in the respective release position 52, 56. See FIGS. 3 and 4, respectively. As further shown in FIG. 4, the slider 8 may be moved into a slider end position 64, which is oriented away from the slider locking position 50 and beyond the slider release position 52. Analogously, the lever 10 may be moved into a lever end position 66, which is situated away from the lever locking position 54 and beyond the lever release position 56.

The first retention section 16 shown in FIG. 1 comprises a first engagement surface 68 extending in the sliding direction 12 and parallel to the pivoting axis 22. The second retention section 26 may comprise a second engagement surface 70. The first engagement surface 68 and the second engagement surface 70 are mutually coplanar when the slider 8 is in the slider locking position 50 and the lever 10 is in the lever locking position 54, respectively, as shown in FIG. 3. The two coplanar engagement surfaces 68, 70 each provide a resting surface 72 for the mounting rail 6. The outwardly extending flanges 74 of the mounting rail 6 rest on the respective engagement surfaces 68, 70 acting as resting surfaces 72.

Still referring to FIG. 3, the first retention section 16 comprises a first latching protrusion 76 extending towards the second retention section 26. The second retention section 26 comprises a second latching protrusion 78 extending towards the first retention section 16. The first latching protrusion 76 protrudes into the reception area 32 when the slider 8 is in the slider locking position 50. The second latching protrusion 78 protrudes into the reception area 32 when the lever 10 in the lever locking position 54. The mounting rail 6 is thus gripped by the respective latching protrusions 76, 78, which extend towards each other, when the mounting rail 6 is received in the reception area 32, the slider 8 is in the slider locking position 50 and the lever 10 is in the lever locking position 54.

For releasing the mounting rail 6, the slider 8 and/or lever 10 is brought into the respective release position 52, 56. In particular, when the slider 8 is moved into the slider release position 52, the first latching protrusion 76 clears the reception area and is on the verge of protruding into the reception area 32 without actually protruding into the reception area 32. Accordingly, when the lever 10 is moved into the lever release position 56 the second latching protrusion 78 clears the reception area 32 and is on the verge of protruding into the reception area 32 without actually protruding into the reception area 32.

In the shown exemplary embodiments, the first engagement surface 68 is formed on the first latching protrusion 76. The second engagement surface 70 is formed on the second latching protrusion 78. Further, the first engagement surface 68 and the second engagement surface 70 face in the rail mounting direction 36 when the slider 8 and lever 10 are in their respective locking positions 50, 54.

At least one of the first retention section 16 and the second retention section 26 may comprise a bevel surface 80 extending obliquely with respect to the rail mounting direction 36. In the exemplary embodiment of FIG. 3, both the first retention section 16 and the second retention section 26 comprise a bevel surface 80. The bevel surfaces 80 form lead-in chamfers 82 which extend through a peripheral zone 84 of the reception area 32. The bevel surfaces 80 are respectively formed on the first retention section 16 and on the second retention section 26, and particularly on the first latching protrusion 76 and on the second latching protrusion 78. The bevel surfaces 80 are respectively aligned with first engagement surface 68 and the second engagement surface 70 in the rail mounting direction 36.

The bevel surfaces 80 allow the retention mechanism 1 to be attached onto the mounting rail 6 during the attachment process of the technical equipment unit 4. The technical equipment unit 4 is pushed onto the mounting rail 6 such that the mounting rail 6 enters into to the peripheral zone 84 of the reception area 32. This state is shown in FIG. 3, with the mounting rail 6 drawn in a broken line 86. By further entering into the reception area 32, the outwardly extending flanges 74 of the mounting rail 6 abut against the bevel surfaces 80 on either side. Upon entering further into the reception area 32, the slider 8 and lever 10 are gradually pressed out of their respective locking positions 50, 54 and towards their respective release positions 52, 56 (see FIG. 4). Once the outwardly extending flanges 74 pass beyond the bevel surfaces 80, the slider 8 and lever 10 return into their respective locking positions 50, 54. This state is shown in FIG. 3 with the mounting rail 6 drawn in a continuous line 88.

The return of the slider 8 and lever 10 into their respective locking positions 50, 54 is achieved by a position restoration element 90, which exerts a force on at least one of the slider 8 and lever 10. In the shown embodiment of FIG. 1, the position restoration element 90 is a resilient element 92 such as a coil spring 94. The coil spring 94 exerts an elastic force 96 on the slider 8, which acts parallel to the sliding direction 12 by abutting with one end 98 against the slider 8. Optionally, the coil spring 94 may be supported by a coil spring support section 100 of the slider 8 projecting from the first hook 18 and extending along the sliding direction 12 (see FIG. 4). The respective other end 102 of the coil spring 94 may abut against a frame 104 of the retention mechanism 1, as shown in FIG. 4, or against a unit housing 106 of the technical equipment unit 4.

In the shown exemplary embodiment of FIG. 1, the frame 104 encloses a groove 108 in which the slider 8 is movably guided and the lever 10 is pivotally held. In particular, the retention mechanism 1 comprising the frame 104 represents a preassembled module 110, which can be readily assembled into the unit housing 106 of the technical equipment unit 4. The frame 104 may comprise at least one guiding slot 112 extending parallel to the groove 108 in the sliding direction 12. For each guiding slot 112, the slider 8 may comprise at least one sliding block 114 projecting into the respective guiding slot 112. A width 116 of the at least one guiding slot 112 measured perpendicular to the sliding direction 12 may be equal to or larger than a width 118 of the corresponding sliding block 114 measured perpendicular to the sliding direction 12. A length 120 of the at least one guiding slot 112 measured parallel to the sliding direction 12 may be larger than a length 122 of the corresponding sliding block 114 measured parallel to the sliding direction 12. As can be seen in FIGS. 1-3, the frame 104 comprises multiple such guiding slots 112 and the slider 8 comprises multiple sliding blocks 114. Further, the frame 104 may comprise at least one fixing hole 124 extending parallel to the pivoting axis 22. In the embodiment of FIG. 1, the frame 104 comprises two fixing holes 124 on opposite sides of the groove 108. For each fixing hole 124, the lever 10 comprises one axle pin 126 projecting into the respective fixing hole 124. The two axle pins 126 are aligned in the direction of the pivoting axis 22.

In the embodiment shown in FIGS. 1-5, the frame 104 has a lateral recess 128. The lateral recess 128 is formed by a cut-out 130, which is substantially cuboid. The lateral recess 128 extends along the sliding direction 12 the rail mounting direction 36 and parallel to the pivoting axis 22. Further, the lateral recess 128 extends at least partially into the groove 108 and at least partially coincides with the reception area 32. The lateral recess 128 thus makes the slider 8 and lever 10 accessible for the mounting rail 6.

The frame 104 may be electrically conductive. In particular, the frame may be made of metal, such as aluminium, copper or stainless steel. Further, the frame 104 shown herein comprises at least one first contact point 132 formed by at least one elastic spring finger 134 extending into the lateral recess 128 and reception area 32, respectively. The frame 104 also comprises at least one second contact point 136 formed by at least one elastic spring finger 134 extending away from the lateral recess 128 of the frame 104.

Preferably, the frame 104 comprises multiple parallel elastic spring fingers 134, which form the first contact point 132 and the second contact prongs 134, respectively. The first contact point 132 may be brought into electrical contact with a metallic surface of the mounting rail 6 for grounding purposes, as shown in FIG. 4. This can be seen in FIG. 4. Also, the second contact point 134 preferably extend inside of the technical equipment unit 4 and electrically contact an electrical component 138, such as a printed circuit board of the technical equipment unit 4. This can be seen in FIG. 5.

The retention mechanism 1 may comprise at least one arresting feature 140 with at least one abutment surface 142 for securing at least one of the slider 8 and lever 10 against movement. The at least one arresting feature 140 may be transferable from a securing state 144 to a disengaging state 146. In particular, the at least one arresting feature 140 may be movable, tiltable, slidable and/or deflectable from the securing state 144 to the disengaging state 146. In the securing state 144, the at least one arresting feature 140 secures the slider 8 and lever 10 against movement. In the disengaging state 146, the at least one arresting feature 140 releases the slider 8 and lever 10 in order to allow their respective movement.

In the exemplary embodiment of FIG. 2, the at least one arresting feature 140 is a latch 148 formed on the frame 104. The latch 148 is adapted to engage with the slider 8 by entering into a notch 150 formed on the main body 14 of the slider 8. In this way, the slider 8 and the lever 10, which is mechanically coupled to the slider 8, are both secured in their respective end positions 64, 66. Alternatively, the slider 8 and lever 10 may be secured in their respective locking positions 50, 54 by the at least one arresting feature 140.

In the embodiment shown in FIG. 4, the at least one arresting feature 140 is formed on the slider 8. In particular, the at least one arresting feature 140 includes a shoulder 152 which engages with an edge 154 of a counterpart arresting feature. In this case, the edge 154 of the counterpart arresting feature is a frame edge 156 of the frame 104. The shoulder 152 is monolithically connected to the main body 14 of the slider 8 by a torsion hinge 158. Further, a release button 160 is arranged on an opposite side 162 of the torsion hinge 158. Thus, when the release button 160 is pressed in a circumferential direction 164 with respect to the torsion hinge 158, the shoulder 152 can be leveraged out of alignment with the frame edge 156.

As can further be seen in FIG. 4, a skew surface 166 is provided on the same side 168 of the torsion hinge 158 as the shoulder 152. The skew surface 166 can abut against the frame edge 156 when the slider 8 is moved from the slider locking position 50 (see FIG. 3) to the slider end position 64. During the course of this movement, the abutment between the skew surface 166 and the frame edge 156 leads to the shoulder 152 being gradually leveraged out of alignment with the frame edge 156. This state is shown in FIG. 4 with broken lines. When the slider 8 reaches the slider end position 64, the shoulder 152 is brought back into alignment with the frame edge 156 (e.g., due to a bias of the torsion hinge 158). This state is shown in FIG. 4 with continuous lines.

FIG. 5 shows a detail of a sectional view of the technical equipment unit 4. The technical equipment unit 4 may comprise a retention mechanism 1 according to the above description, and a unit housing 106, wherein the unit housing 106 has a receptacle 170 for receiving the retention mechanism 1. For the sake of clarity, only the frame 104 of the retention mechanism 1 is shown in FIG. 5.

The preassembled module 110 described above may be assembled to the unit housing 106. The frame 104 may comprise a combination of latching features 172 and connectors 174. By means of the connectors 174, connections 176 with a counterconnector 178 formed in the receptacle 170 of the unit housing 106 are established, respectively. By means of the latching features 172, latching connections 180 with counterpart latching features 182 formed in the receptacle 170 of the unit housing 106 are established, respectively. This state is shown in FIG. 5.

Further, at least one of the retention mechanism 1 or the unit housing 106 may comprise at least one tensioning element 184 for introducing a pre-stress between the retention mechanism 1 and the unit housing 106. In the exemplary embodiment of FIG. 5, each tensioning element 184 is formed by a plastically deformable tab 186 of the frame 104 which abuts against a surface 188 of the unit housing 106. The frame 104 comprises two such tabs 186 (see FIG. 1). Due to this abutment, the retention mechanism 1 is pressed away from the unit housing 106. This eliminates play 190 between the retention mechanism 1 and the unit housing 106 (e.g., introduced by manufacturing tolerances and/or the latching connections 180). In the exemplary embodiment, the technical equipment unit 4 is a PCB module 192 comprising at least one printed circuit board. Alternatively, the technical equipment unit 4 may be a circuit breaker or any other type of functional and/or electrical component which requires attachment to the mounting rail 6.

It should be appreciated for those skilled in this art that the above embodiments are intended to be illustrated, and not restrictive. For example, many modifications may be made to the above embodiments by those skilled in this art, and various features described in different embodiments may be freely combined with each other without conflicting in configuration or principle.

Although several exemplary embodiments have been shown and described, it would be appreciated by those skilled in the art that various changes or modifications may be made in these embodiments without departing from the principles and spirit of the disclosure, the scope of which is defined in the claims and their equivalents.

As used herein, an element recited in the singular and proceeded with the word "a" or "an" should be understood as not excluding plural of said elements or steps, unless such exclusion is explicitly stated. Furthermore, references to "one embodiment" of the present disclosure are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

What is claimed is:

1. A retention mechanism for attaching an equipment unit to a mounting rail, comprising:
   a frame;
   a slider arranged in the frame and including a first retention section, the slider movable in a translational manner along a sliding direction with respect to a remaining portion of the retention mechanism; and
   a lever including a second retention section aligned with the first retention section in the sliding direction, and a reception area for receiving the mounting rail being defined between the first retention section and the second retention section, the lever pivotally coupled to the frame about a pivoting axis, a free end of the lever opposite the second retention section slidably arranged within a cavity defined through the slider.

2. The retention mechanism according to claim 1, wherein the free end of the lever is retained within the cavity by two inner walls of the cavity, the two inner walls opposing the free end of the lever and arranged opposite one another in the sliding direction.

3. The retention mechanism according to claim 2, wherein the slider is movable between a slider locking position and a slider release position, the lever is movable between a lever locking position and a lever release position, and the lever is moved into the lever release position when the slider is moved into the slider release position.

4. The retention mechanism according to claim 3, wherein the first retention section includes a first engagement surface extending in the sliding direction and parallel to the pivoting axis, the second retention section includes a second engagement surface, and the first engagement surface and the second engagement surface are mutually coplanar when the slider is in the slider locking position and the lever is in the lever locking position.

5. The retention mechanism according to claim 1, wherein the first retention section includes a first latching protrusion extending towards the second retention section, and the second retention section includes a second latching protrusion extending towards the first retention section.

6. The retention mechanism according to claim 1, wherein the pivoting axis extends perpendicularly to the sliding direction, and the reception area receives the mounting rail along a rail mounting direction, the rail mounting direction extending linearly towards a plane spanned by the sliding direction and the pivoting axis.

7. The retention mechanism according to claim 6, wherein at least one of the first retention section and the second retention section includes a bevel surface extending obliquely with respect to the rail mounting direction, each bevel surface forming a lead-in chamfer.

8. The retention mechanism according to claim 1, further comprising a position restoration element exerting a force on at least one of the slider or the lever in a direction toward the reception area.

9. The retention mechanism according to claim 1, wherein the frame defines a groove for movably guiding the slider.

10. The retention mechanism according to claim 9, wherein the frame defines a lateral recess formed through at least one sidewall thereof, the recess guiding a sliding block of the frame in the sliding direction.

11. The retention mechanism according to claim 9, wherein the frame is electrically conductive and includes at least one first contact point extending into the reception area and at least one second contact point extending away from the reception area.

12. The retention mechanism according to claim 1, further comprising at least one arresting element having at least one abutment surface for securing at least one of the slider or the lever against movement.

13. The retention mechanism according to claim 12, wherein the at least one arresting element is moveable from a securing state to a disengaging state.

14. The retention mechanism according to claim 2, wherein the two inner walls are curved in respective circumferential directions.

15. A retention mechanism for attaching an equipment unit to a mounting rail, comprising:
a frame
a slider movably arranged on the frame and including a first retention section, the slider movable in a translational manner along a sliding direction with respect to a remaining portion of the retention mechanism; and
a lever including a second retention section aligned with the first retention section in the sliding direction, and a reception area for receiving the mounting rail being defined between the first retention section and the second retention section, the lever mechanically coupled to the slider and pivotable about a pivoting axis; and
at least one deformable tab extending from the frame and adapted to introduce a pre-stress between the retention mechanism and an equipment unit mounted thereto.

16. A retention mechanism for attaching equipment to a mounting rail, comprising:
a frame defining a groove in a longitudinal direction thereof;
a slider including a first retention section and movably mounted within the groove in a sliding direction;
a lever pivotally mounted to the frame and mechanically coupled to the slider, the lever including a second retention section aligned with the first retention section in the sliding direction, and a reception area for receiving the mounting rail defined between the first retention section and the second retention section; and
an arresting latch arranged on one of the slider or the frame and selectively engaging with the other one of the slider or the frame, the arresting latch fixing the slider and the lever in respective locking positions.

17. The retention mechanism according to claim 16, further comprising at least one elastic spring finger having a first end extending above the frame for electrically contacting the equipment and a second end extending into the reception area for electrically contacting the mounting rail.

18. The retention mechanism according to claim 16, wherein the slider is movable between a slider locking position and a slider release position, the lever is movable between a lever locking position and a lever release position, and the lever is moved into the lever locking position by the slider when the slider is moved into the slider locking position.

19. The retention mechanism according to claim 16, wherein the first retention section includes a first latching protrusion extending towards the second retention section, and the second retention section includes a second latching protrusion extending towards the first retention section.

20. The retention mechanism according to claim 16, further comprising an elastic position restoration element exerting a force on at least one of the slider or the lever in a direction toward the reception area.

* * * * *